United States Patent
Hayashi

(10) Patent No.: US 11,482,929 B2
(45) Date of Patent: Oct. 25, 2022

(54) POWER SUPPLY CONTROLLER

(71) Applicant: ROHM Co., LTD., Kyoto (JP)

(72) Inventor: Hidekazu Hayashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 42 days.

(21) Appl. No.: 17/204,111

(22) Filed: Mar. 17, 2021

(65) Prior Publication Data

US 2021/0305897 A1    Sep. 30, 2021

(30) Foreign Application Priority Data

Mar. 25, 2020    (JP) .............................. JP2020-054471

(51) Int. Cl.
*H02M 3/156*    (2006.01)
*H03K 7/08*    (2006.01)
*H02M 1/36*    (2007.01)
*H02M 1/00*    (2006.01)

(52) U.S. Cl.
CPC ............. *H02M 3/156* (2013.01); *H02M 1/36* (2013.01); *H03K 7/08* (2013.01); *H02M 1/0025* (2021.05); *H02M 1/0041* (2021.05)

(58) Field of Classification Search
CPC ...... H02M 3/156; H02M 1/36; H02M 1/0025; H02M 1/0041
See application file for complete search history.

(56) References Cited

U.S. PATENT DOCUMENTS

| 8,599,521 B2 * | 12/2013 | Hara ..................... | H02M 3/156 361/18 |
| 2016/0028311 A1 * | 1/2016 | Murakami .......... | H02M 3/1588 323/271 |

FOREIGN PATENT DOCUMENTS

JP    2016019455    2/2016

* cited by examiner

*Primary Examiner* — Adolf D Berhane
*Assistant Examiner* — Afework S Demisse
(74) *Attorney, Agent, or Firm* — Chip Law Group

(57) ABSTRACT

A power supply controller used in a DC/DC converter includes a feedback control unit that generates a pulse-shaped PWM signal having a first level that is one of a high level and a low level and a second level that is the other of the high level and the low level, on the basis of a feedback voltage based on an output voltage of the DC/DC converter; a low voltage detection unit that detects a low voltage of the feedback voltage; and a selection unit that chooses, as a chosen clock signal, a first clock signal having a high duty when the low voltage is not detected by the low voltage detection unit, and chooses a second clock signal having a low duty when the low voltage is detected by the low voltage detection unit. The feedback control unit includes a reset signal generation unit that generates a pulse-shaped reset signal having the first level and the second level, based on the feedback voltage, and a PWM signal generation unit that generates the PWM signal at the first level during a period that is an overlap between a period during which the reset signal is at the first level and a period during which the chosen clock signal is at the first level.

10 Claims, 9 Drawing Sheets

POWER SUPPLY CONTROLLER

CROSS REFERENCE TO RELATED APPLICATIONS

This application claims priority benefit of Japanese Patent Application No. JP 2020-054471 filed in the Japan Patent Office on Mar. 25, 2020. Each of the above-referenced applications is hereby incorporated herein by reference in its entirety.

BACKGROUND

The present disclosure relates to a power supply controller for a direct to direct (DC/DC) converter.

In related art, there are various DC/DC converters such as a DC/DC converter of a step-down type. For example, JP 2016-19455A discloses a step-down DC/DC converter.

In such a DC/DC converter as disclosed in JP 2016-19455A, a feedback voltage is generated by dividing the output voltage by resistors, and the feedback voltage is input to an error amplifier to perform pulse width modulation (PWM) control, thereby setting the output voltage to a constant value for stabilization.

SUMMARY

In such a DC/DC converter as disclosed in JP 2016-19455A, the output voltage applied to an external terminal of an integrated circuit (IC) is divided by voltage dividing resistors built in the IC. With such a configuration, when an abnormality in which the external terminal is opened occurs, the feedback voltage that has been subjected to the resistance voltage division becomes the ground potential (0 V), and the output of the error amplifier becomes the maximum value that can be output, so that the PWM duty becomes the maximum value. As a result, the output voltage of the DC/DC converter becomes an overvoltage, and the overvoltage is applied to the subsequent circuit.

In view of the above situation, it is desirable to provide a power supply controller capable of protecting the subsequent circuit of the DC/DC converter even when an abnormality of the feedback voltage occurs.

One mode of the present disclosure is a power supply controller used in a DC/DC converter, the power supply controller including:

a feedback control unit that generates a pulse-shaped PWM signal having a first level that is one of a high level and a low level and a second level that is the other of the high level and the low level, on the basis of a feedback voltage based on an output voltage of the DC/DC converter;

a low voltage detection unit that detects a low voltage of the feedback voltage; and a selection unit that chooses a first clock signal with a high duty when the low voltage is not detected by the low voltage detection unit, and chooses a second clock signal with a low duty when the low voltage is detected by the low voltage detection unit, as a chosen clock signal, in which the feedback control unit includes a reset signal generation unit that generates a pulse-shaped reset signal having the first level and the second level on the basis of the feedback voltage, and a PWM signal generation unit that generates the PWM signal at the first level during the period that is the overlap between the period when the reset signal is at the first level and the period when the chosen clock signal is at the first level (first configuration).

Further, in the above first configuration, the PWM signal generation unit may be an AND circuit into which the reset signal and the chosen clock signal are input (second configuration).

Further, in the above first or second configuration, the reset signal generation unit may include an error amplifier to which the feedback voltage and a reference voltage are input, a slope generation unit that generates a slope signal, and a PWM comparator to which an error signal output from the error amplifier and the slope signal are input (third configuration).

Further, the third configuration has a soft start unit that raises the reference voltage at startup, and the selection unit may ignore the detection result from the low voltage detection unit until a signal indicating the completion of the soft start is output from the soft start unit (fourth configuration).

Further, in any one of the above first to fourth configurations, the low voltage detection unit may include a resistor with one end connected to a terminal to which a power supply voltage is applied, and a negative-channel metal oxide semiconductor (NMOS) transistor including a drain connected to the other end of the resistor, a source connected to a terminal to which the ground potential is applied, and a gate to which a voltage based on the output voltage is applied (fifth configuration).

Further, in any one of the above first to fourth configurations, the low voltage detection unit may have a comparator in which a voltage based on the output voltage and a threshold voltage are input (sixth configuration).

Further, in any one of the above first to sixth configurations, in the case where the low voltage is detected by the low voltage detection unit and a level of the first clock signal chosen at that time is the first level, the selection unit may maintain the choice of the first clock signal while the first level is maintained, and the selection unit may switch to the choice of the second clock signal when the first clock signal is switched to the second level (seventh configuration).

Further, any one of the above first to seventh configurations may include an external terminal to which the output voltage is applied, and a voltage dividing resistor that divides a terminal voltage of the external terminal to generate the feedback voltage (eighth configuration).

Further, any one of the above first to seventh configurations may include a first external terminal to which the feedback voltage is applied, and a second external terminal to which the ground potential is applied and that is arranged near the first external terminal (ninth configuration).

Further, another mode of the present application is a DC/DC converter including the power supply controller having any one of the above configurations and a transistor that is switched on the basis of a PWM signal generated by the power supply controller.

According to the power supply controller of the mode of the present disclosure, the subsequent circuit of the DC/DC converter can be protected even when an abnormality of the feedback voltage occurs.

DETAILED DESCRIPTION OF THE PREFERRED EMBODIMENTS

Exemplary embodiments of the present disclosure will be described below with reference to the drawings.

<Configuration of DC/DC Converter>

Figure 1:
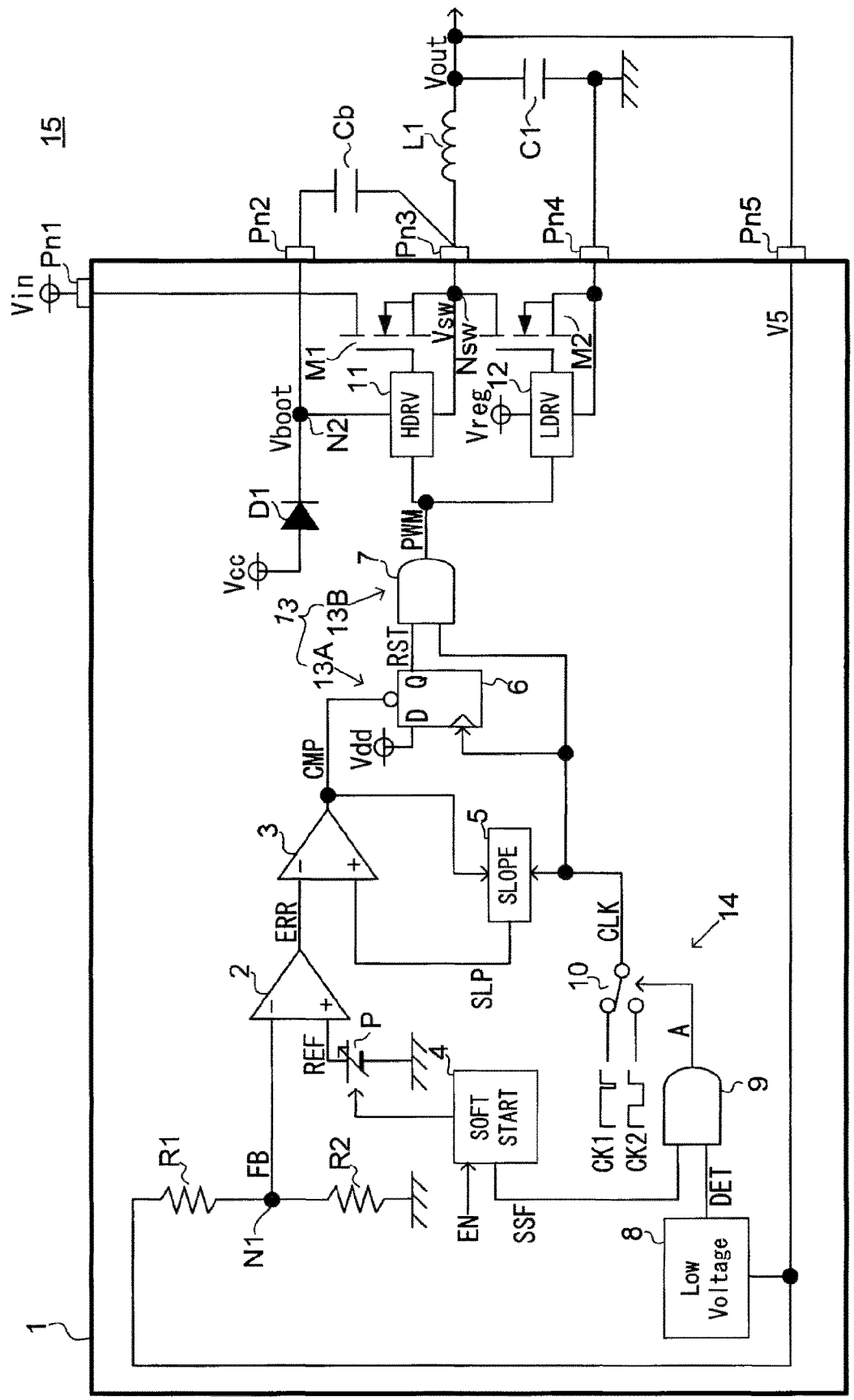
FIG. 1 is a diagram illustrating a configuration of a DC/DC converter according to a first embodiment of the present disclosure.

FIG. 1 is a diagram illustrating a configuration of a DC/DC converter 15 including a power supply controller 1 according to a first embodiment of the present disclosure.

The DC/DC converter 15 illustrated in FIG. 1 is a step-down DC/DC converter that steps down an input voltage Vin to generate an output voltage Vout and then supplies the output voltage Vout to a subsequent circuit (not illustrated). The DC/DC converter 15 includes the power supply controller 1, an inductor L1, an output capacitor C1, and a boot capacitor Cb. The inductor L1, the output capacitor C1, and the boot capacitor Cb are discrete elements arranged outside the power supply controller 1.

The power supply controller 1 illustrated in FIG. 1 is a semiconductor IC including an error amplifier 2, a PWM comparator 3, a soft start unit 4, a slope generation unit 5, a D flip-flop 6, an AND circuit 7, a low voltage detection unit 8, an AND circuit 9, a selector 10, a high-side driver 11, a low-side driver 12, an NMOS transistor M1, an NMOS transistor M2, a diode D1, voltage dividing resistors R1 and R2, which are integrated into one chip.

Note that a reset signal generation unit 13A includes the error amplifier 2, the PWM comparator 3, the slope generation unit 5, and the D flip-flop 6. A PWM signal generation unit 13B has the AND circuit 7. A feedback voltage control unit 13 includes the reset signal generation unit 13A and the PWM signal generation unit 13B.

Further, a selection unit 14 includes the low voltage detection unit 8 and the AND circuit 9.

Further, the power supply controller 1 has external terminals Pn1 to Pn5 for establishing an electrical connection with the outside.

Note that the NMOS transistors M1 and M2 may be arranged outside the power supply controller 1.

The NMOS transistor M1 and the NMOS transistor M2 are connected in series between the external terminal Pn1 to which the input voltage Vin is applied and the external terminal Pn4 to which the ground potential is applied. To be specific, the drain of the NMOS transistor M1 is connected to the external terminal Pn1. The source of the NMOS transistor M1 is connected to the drain of the NMOS transistor M2 at a node Nsw. The source of the NMOS transistor M2 is connected to the external terminal Pn4. That is, the NMOS transistor M1 is a high-side transistor on the high potential side, and the NMOS transistor M2 is a low-side transistor on the low potential side.

One end of the inductor L1 is connected to the node Nsw via the external terminal Pn3. The other end of the inductor L1 is connected to one end of the output capacitor C1. The other end of the output capacitor C1 is connected to a terminal to which the ground potential is applied. The output voltage Vout is generated at one end of the output capacitor C1.

The output voltage Vout is applied to the external terminal Pn5. The external terminal Pn5 is connected to one end of the voltage dividing resistor R1. The other end of the voltage dividing resistor R1 is connected to one end of the voltage dividing resistor R2 at a node N1. The other end of the voltage dividing resistor R2 is connected to a terminal to which the ground potential is applied. That is, the voltage dividing resistors R1 and R2 are connected in series between the external terminal Pn5 and the terminal to which the ground potential is applied. By dividing the output voltage Vout by the voltage dividing resistors R1 and R2, a feedback voltage FB is generated at the node N1.

The feedback voltage FB is applied to an inverting input end (−) of the error amplifier 2. A reference voltage REF generated by a reference voltage source P is applied to a non-inverting input end (+) of the error amplifier 2. The reference voltage source P generates variable reference voltages REF for soft start, which will be described later.

The error amplifier 2 amplifies the error between the feedback voltage FB and the reference voltage REF to generate an error signal ERR. The error signal ERR is applied to an inverting input end (−) of the PWM comparator 3.

The slope generation unit 5 generates a serrated slope signal SLP. The slope signal SLP is applied to a non-inverting input end (+) of the PWM comparator 3. The PWM comparator 3 compares the error signal ERR with the slope signal SLP to generate a comparison signal CMP.

The selector 10 chooses one of a first clock signal CK1 with a high duty and a second clock signal CK2 with a low duty and outputs the chosen one as a chosen clock signal CLK. The first clock signal CK1 and the second clock signal CK2 are pulse signals having the same cycle. The ratio of the high level period in one cycle (duty) is higher in the first clock signal CK1 than in the second clock signal CK2. For example, the duty of the first clock signal CK1 is 90%, and the duty of the second clock signal CK2 is 50%.

A power supply voltage Vdd is applied to a D terminal of the D flip-flop 6. The chosen clock signal CLK is applied to a clock terminal of the D flip-flop 6. The comparison signal CMP is applied to a reset terminal of the D flip-flop 6. A reset signal RST is output from a Q terminal of the D flip-flop 6. The reset signal RST is a pulse-shaped signal having a high level and a low level.

The reset signal RST is applied to one input end of the AND circuit 7. The chosen clock signal CLK is applied to the other input end of the AND circuit 7. The AND circuit 7 takes the logical product of the reset signal RST and the chosen clock signal CLK and outputs a PWM signal PWM. The PWM signal PWM is a pulse-shaped signal having a high level and a low level.

Note that, upon input of the chosen clock signal CLK, the slope generation unit 5 receives the rising edge of the chosen clock signal CLK and starts to raise the slope signal SLP from the initial value. Further, upon input of the comparison signal CMP, the slope generation unit 5 receives the rising edge of the comparison signal CMP and resets the slope signal SLP to the initial value. Note that, after the reset, the slope generation unit 5 maintains the slope signal SLP at the initial value until the rising edge of the chosen clock signal CLK is received.

Feedback control is performed by the error amplifier 2, the PWM comparator 3, the slope generation unit 5, the D flip-flop 6, and the AND circuit 7 to generate the PWM signal PWM such that the feedback voltage FB agrees with the reference voltage REF. As a result, the output voltage Vout is controlled to be a constant value defined by the reference voltage REF and the resistance values of the voltage dividing resistors R1 and R2.

The high-side driver 11 turns on and off the NMOS transistor M1 on the basis of the PWM signal PWM. The low-side driver 12 turns on and off the NMOS transistor M2 on the basis of the PWM signal PWM. The NMOS transistors M1 and M2 are complementarily switched such that one is on while the other is off. Note that the term "complementarily" includes setting a dead time that is a period in which both are off, from the viewpoint of preventing a through current, for example.

Here, one end of the boot capacitor Cb is connected to the external terminal Pn3. The other end of the boot capacitor Cb is connected to the external terminal Pn2. The external terminal Pn2 is connected to a cathode of the diode D1 at a node N2. A power supply voltage Vcc is applied to an anode of the diode D1. A boot voltage Vboot is generated at the node N2 by the bootstrap including the boot capacitor Cb and the diode D1. A power supply voltage higher than the input voltage Vin can be supplied to the high-side driver 11 by the boot voltage Vboot.

The high-side driver 11 turns on the NMOS transistor M1 by applying the boot voltage Vboot to a gate of the NMOS transistor M1. The high-side driver 11 turns off the NMOS transistor M1 by applying a switch voltage Vsw of the node Nsw to the gate of the NMOS transistor M1.

Further, the low-side driver 12 turns on the NMOS transistor M2 by applying a power supply voltage Vreg to a gate of the NMOS transistor M2. The low-side driver 12 turns off the NMOS transistor M2 by applying a ground potential to the gate of the NMOS transistor M2.

Note that a PMOS transistor may be used as the high-side transistor. In this case, no bootstrap is needed.

The low voltage detection unit 8 detects whether or not a terminal voltage V5 of the external terminal Pn5 is low, and outputs a detection signal DET. That is, the low voltage detection unit 8 detects the low voltage of the feedback voltage FB. Due to this, since the terminal voltage V5 becomes the output voltage Vout in the normal state, the low voltage detection unit 8 detects that the terminal voltage V5 is not a low voltage and is normal. In this case, the low voltage detection unit 8 outputs a low level detection signal DET. On the other hand, when the external terminal Pn5 is opened due to, for example, improper mounting of the power supply controller 1, the terminal voltage V5 becomes the ground potential (0 V), and the low voltage detection unit 8 detects that the terminal voltage V5 is low and is an abnormal state. In this case, the low voltage detection unit 8 outputs a high level detection signal DET.

The soft start unit 4 controls the soft start when the power supply controller 1 is started. The soft start will be described with reference to the timing chart illustrated in FIG. 2.

Figure 2:
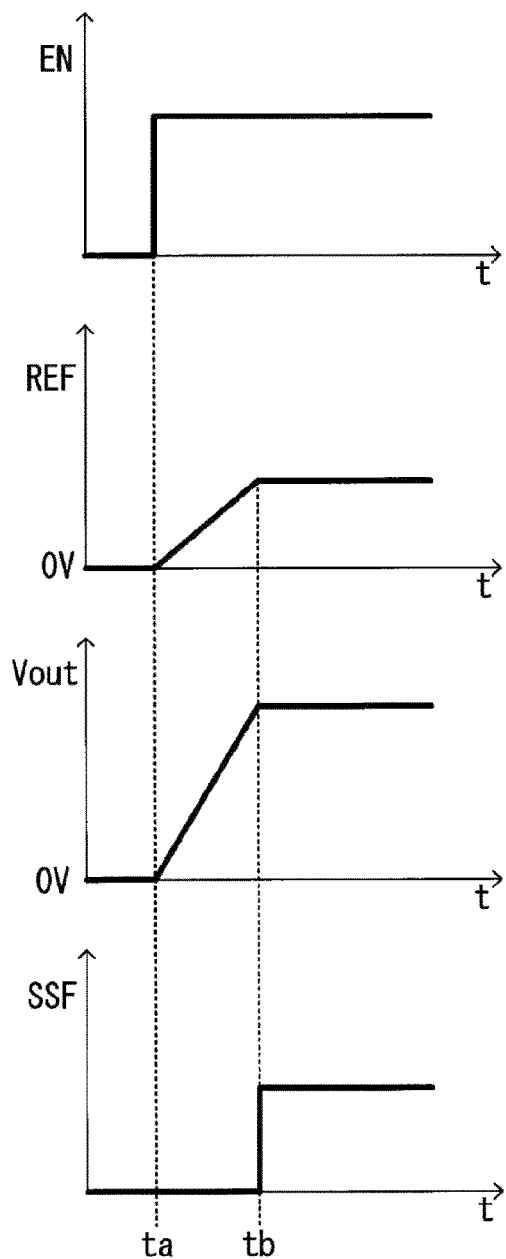
FIG. 2 is a timing chart illustrating an example of soft start.

When an enable signal EN rises from a low level to a high level at the timing to illustrated in FIG. 2, the soft start unit 4 controls the reference voltage source P so as to start the rise of the reference voltage REF. At this time, the output voltage Vout starts to rise according to the feedback control based on the feedback voltage FB. Further, at this time, the soft start unit 4 outputs a low-level soft start completion signal SSF.

Then, at the timing tb when the reference voltage REF reaches a constant value that is constant in time, the soft start unit 4 switches the soft start completion signal SSF from a low level to a high level, assuming that the soft start is completed. With such a soft start, overshoot of the output voltage Vout can be suppressed.

The soft start completion signal SSF is applied to one input end of the AND circuit 9. The detection signal DET is applied to the other input end of the AND circuit 9. As a result, even if the low voltage detection unit 8 detects a low voltage of the terminal voltage V5 because the output voltage Vout is low at startup, the soft start completion signal SSF is at a low level, so that an output A of the AND circuit 9 is at a low level. When the output A is low level, the selector 10 chooses the first clock signal CK1 as a normal time option. That is, accidentally choosing the second clock signal CK2 that is an option at the abnormal time can be avoided at startup.

After the soft start completion signal SSF is switched to the high level, the output A of the AND circuit 9 has a level corresponding to the level of the detection signal DET. Therefore, since the detection signal DET is at a low level in the normal state, the output A is at a low level, and the first clock signal CK1 is chosen by the selector 10. On the other hand, if an abnormality occurs, the detection signal DET rises to a high level. Accordingly, the output A rises to a high level, and the selector 10 chooses the second clock signal CK2. As will be described later, the second clock signal CK2 is used to suppress the duty of the PWM signal PWM in the case of an abnormality.

In this way, the selection unit 14 ignores the detection result from the low voltage detection unit 8 until the soft start completion signal SSF indicating the completion of the soft start is output from the soft start unit 4.

<Configuration of Low Voltage Detection Unit>

Figure 3:
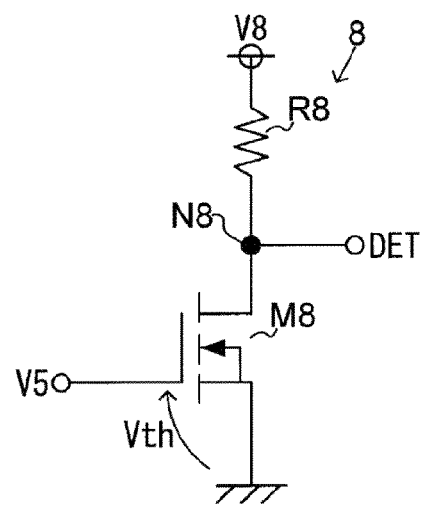
FIG. 3 is a diagram illustrating a first configuration example of a low voltage detection unit.

FIG. 3 is a diagram illustrating a first configuration example of the low voltage detection unit 8. The low voltage detection unit 8 illustrated in FIG. 3 has an NMOS transistor M8 and a pull-up resistor R8.

One end of the pull-up resistor R8 is connected to a terminal to which a power supply voltage V8 is applied. The other end of the pull-up resistor R8 is connected to the drain of the NMOS transistor M8 at a node N8. The source of the NMOS transistor M8 is connected to a terminal to which the ground potential is applied. The terminal voltage V5 is applied to a gate of the NMOS transistor M8. The detection signal DET is generated at the node N8.

If the terminal voltage V5 exceeds a threshold voltage Vth of the NMOS transistor M8 in the normal state, the NMOS transistor M8 is turned on, and the detection signal DET is at a low level (ground potential). On the other hand, if the terminal voltage V5 is lower than the threshold voltage Vth at the time of abnormality, the NMOS transistor M8 is turned off, and the detection signal DET is at a high level (V8).

The threshold voltage Vth is set to a value higher than 0 V and lower than the voltage value of the output voltage Vout at the normal time. For example, when the input voltage Vin is 12 V and the normal output voltage Vout is 3.3 V, the threshold voltage Vth is set to 0.5 V as a typ value, for example. However, the threshold voltage Vth changes due to variations and temperature characteristics. If the typ value is the threshold voltage Vth of 0.5 V, the maximum value of Vth is, for example, 0.5 V×1.3+0.2 V=0.85 V. Note that 1.3 indicates the variation and that 0.2 V indicates the temperature characteristics. However, when the output voltage Vout in the normal state has a margin from 0 V such as in the case of a voltage of 3.3 V, there is no problem even if the threshold voltage Vth changes to the maximum value as described above.

On the other hand, when the output voltage Vout in the normal state has no margin from 0 V such as in the case of a voltage of 0.8 V, the output voltage Vout in the normal state may be lower than the maximum value of the threshold voltage Vth, and there is a possibility that erroneous detection will occur in the normal detection by the low voltage detection unit 8.

Figure 4:
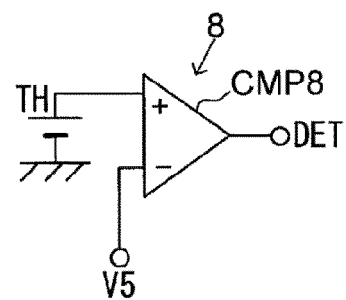
FIG. 4 is a diagram illustrating a second configuration example of the low voltage detection unit.

In particular, in such a case, it is desirable to use the low voltage detection unit 8 of the second configuration example illustrated in FIG. 4. The low voltage detection unit 8 illustrated in FIG. 4 includes a comparator CMP8. The terminal voltage V5 is applied to an inverting input end (−) of the comparator CMP8. A threshold voltage TH is applied to a non-inverting input end (+) of the comparator CMP8. The comparator CMP8 outputs a comparison result of the terminal voltage V5 and the threshold voltage TH as the detection signal DET.

As a result, if the terminal voltage V5 exceeds the threshold voltage TH in the normal state, the detection signal DET is at a low level, and if the terminal voltage V5 falls below the threshold voltage TH in the abnormal state, the detection signal DET is at a high level.

<Operation when Abnormality is Detected>

Next, the operation when an abnormality is detected in the power supply controller 1 will be described. First, the normal operation of the power supply controller 1 will be described with reference to the timing chart illustrated in FIG. 5.

Figure 5:
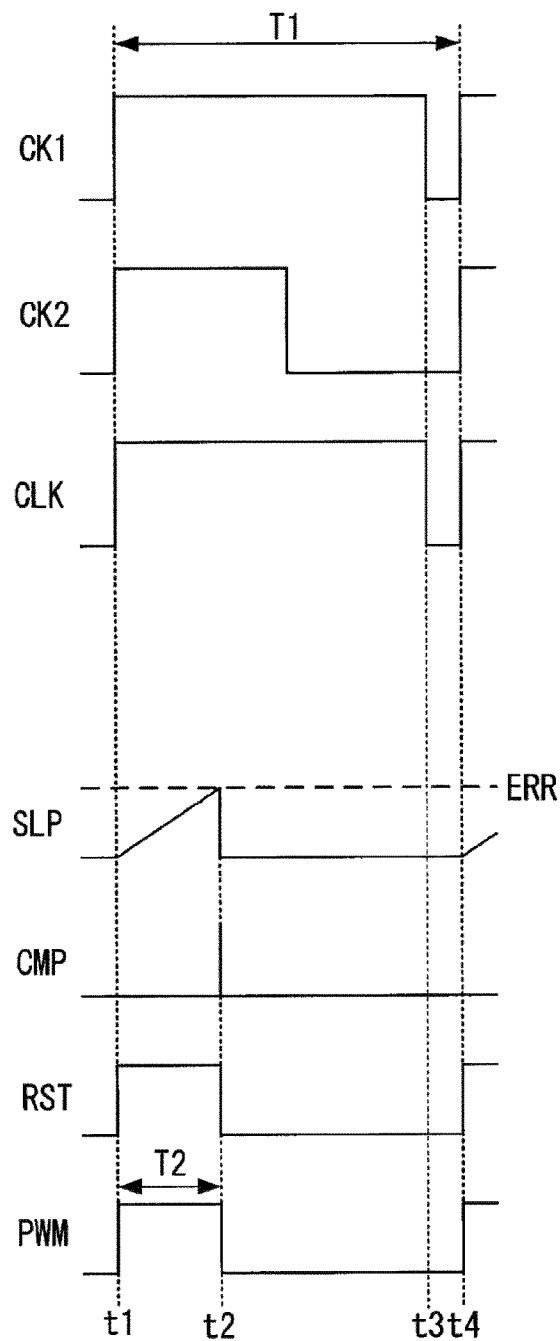
FIG. 5 is a timing chart illustrating an operation example of a power supply controller in a normal state.

Note that, in FIG. 5, waveform examples of the first clock signal CK1, second clock signal CK2, chosen clock signal CLK, error signal ERR, slope signal SLP, reset signal RST, and PWM signal PWM are illustrated in order from the upper row. Further, here, the high level corresponds to the first level, and the low level corresponds to the second level.

At the timing t1, the first clock signal CK1 and the second clock signal CK2 rise from a low level to a high level. Here, since the terminal voltage V5 is a value at the normal state, the low voltage detection unit 8 does not detect the low voltage, and the selector 10 chooses the first clock signal CK1. As a result, the chosen clock signal CLK as the first clock signal CK1 rises to a high level.

Upon receiving the rise of the chosen clock signal CLK, the slope signal SLP starts rising from the initial value. Further, in response to the rise of the chosen clock signal CLK, the D flip-flop 6 raises the reset signal RST to a high level. Due to this, the PWM signal PWM rises to a high level.

After that, when the slope signal SLP rises and exceeds the error signal ERR at the timing t2, the comparison signal CMP rises to a high level. As a result, the D flip-flop 6 is reset, and the reset signal RST drops to a low level. Therefore, the PWM signal PWM drops to a low level.

Further, in response to the comparison signal CMP rising to a high level, the slope generation unit 5 drops the slope signal SLP to the initial value. Thereby, the comparison signal CMP drops to a low level. After that, the slope generation unit 5 maintains the slope signal SLP at the initial value until the chosen clock signal CLK rises.

After that, at the timing t3 when the first clock signal CK1 falls to a low level, the chosen clock signal CLK also falls. After that, at the timing t4 when the first clock signal CK1 and the second clock signal CK2 rise to a high level, the chosen clock signal CLK also rises.

In response to the rise of the chosen clock signal CLK, the reset signal RST rises due to the D flip-flop 6. Thereby, the PWM signal PWM also rises.

In this way, the PWM signal PWM is generated so as to be at the high level (first level) during the period (t1 to t2) that is an overlap between the period during which the reset signal RST is at a high level (first level) and the period during which the chosen clock signal CLK is at a high level (first level).

The duty of the PWM signal PWM, which is the ratio of a period T2 during which the PWM signal PWM is at a high level to a cycle T1 of the first clock signal CK1 and the second clock signal CK2 (=cycle of the PWM signal PWM), is a value corresponding to the output voltage Vout at the normal time with respect to the input voltage Vin. For example, if Vin=12 V and Vout=3.3 V, the abovementioned duty is 3.3/12=28%.

Figure 6:
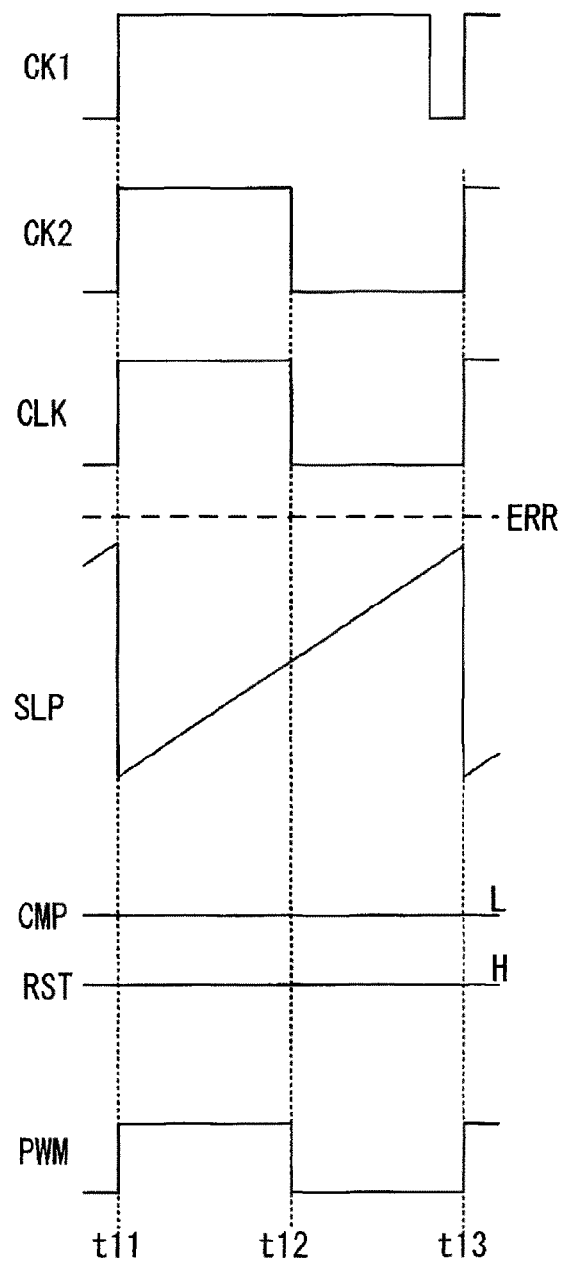
FIG. 6 is a timing chart illustrating an operation example of the power supply controller in an abnormal state.

Next, the operation of the power supply controller 1 at the time of abnormality will be described with reference to the timing chart illustrated in FIG. 6. Here, this is a case where an abnormality in which the external terminal Pn5 is opened occurs, and the terminal voltage V5 becomes the ground potential (0 V), so that the low voltage detection unit 8 detects the low voltage, and the selector 10 chooses the second clock signal CK2. Accordingly, the chosen clock signal CLK becomes the second clock signal CK2.

At the timing t11, the slope signal SLP starts rising from the initial value in response to the rising of the chosen clock signal CLK.

Since the terminal voltage V5 becomes the ground potential, the error signal ERR, which is the output of the error amplifier 2, rises to the maximum value that can be output by the error amplifier 2. Meanwhile, although the slope signal SLP rises, at the timing t13, while the slope signal SLP remains below the error signal ERR, the second clock signal CK2 and the chosen clock signal CLK rise. That is, since the comparison signal CMP remains at the low level, the reset signal RST remains at the high level. As a result, the duty of the reset signal RST becomes 100%.

However, at the timing t12 before the timing t13, the second clock signal CK2 and the chosen clock signal CLK drop. Because of this, even if the reset signal RST remains at a high level, the PWM signal PWM drops at the timing t12.

In this way, the PWM signal PWM is generated so as to be at a high level (first level) during the period (t11 to t12) that is an overlap between the period during which the reset signal RST is at the high level (first level) and the period during which the chosen clock signal CLK is at the high level (first level).

That is, even when an abnormality occurs in which the external terminal Pn5 is opened and the terminal voltage V5 becomes a low voltage, the duty of the PWM signal PWM is limited by the low duty of the second clock signal CK2. For example, if the duty of the second clock signal CK2 is 50%, the duty of the PWM signal PWM is 50%, and if the input voltage Vin is 12 V, the output voltage Vout is limited to 12 V×50%=6 V.

In the case of a configuration in which only the first clock signal CK1 is available as the clock signal and the second clock signal CK2 is not available, since the AND circuit 7 takes the logical product of the first clock signal CK1 and the reset signal RST, the PWM signal PWM takes over the high duty of the first clock signal CK1. For example, when the duty of the first clock signal CK1 is 90%, the duty of the PWM signal PWM is 90%, and when the input voltage Vin is 12 V, the output voltage Vout is 12 V×90%=11 V, which indicates an overvoltage.

As described above, in the present embodiment, applying the overvoltage of the output voltage Vout to the subsequent circuit can be avoided at the time of abnormality.

Further, as in the existing control, according to a control in which the transistor switching is stopped for the shutdown when a predetermined period (for example, 1 to 5 ms) elapses from the abnormality detection, the switching continues to operate during the above predetermined period, so that the output voltage continues to rise. On the other hand, in the present embodiment, even if the output voltage rises, the voltage can be limited to a predetermined limiting voltage.

Further, when the predetermined period is short, the system will be shut down if an abnormality is detected even for a moment. On the other hand, in the present embodiment, if the open state of the external terminal Pn5 immediately returns to the normal state, the low voltage detection unit 8 does not detect the low voltage, and the selector 10 chooses the first clock signal CK1, so that the switching of the NMOS transistors M1 and M2 is continued.

<Second Embodiment of Power Supply Controller>

Figure 7:
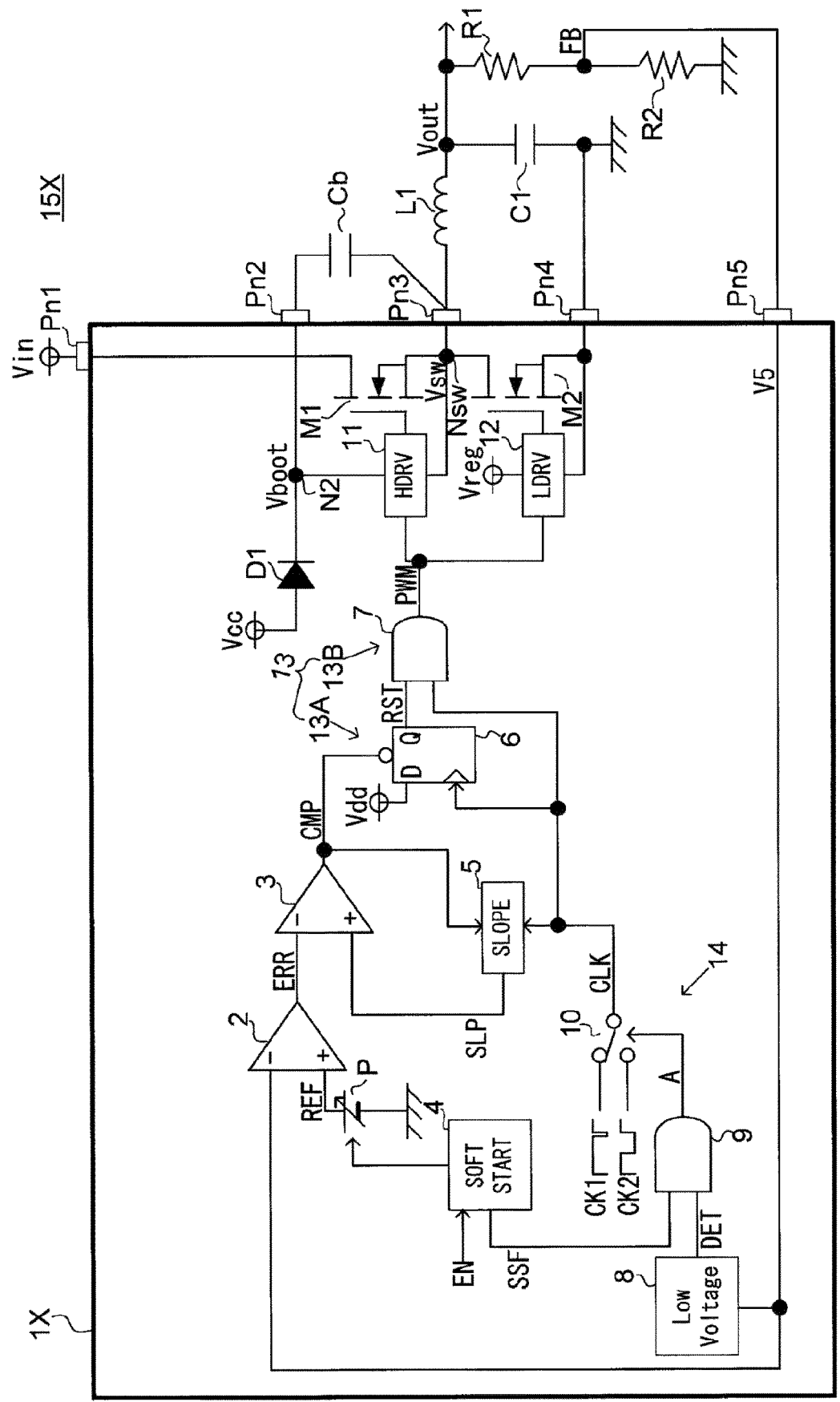
FIG. 7 is a diagram illustrating a configuration of a DC/DC converter according to a second embodiment of the present disclosure.

FIG. 7 is a diagram illustrating a configuration of a DC/DC converter 15X including a power supply controller 1X according to a second embodiment.

The difference from the above-mentioned first embodiment (FIG. 1) in the configuration of the DC/DC converter 15X of the present embodiment is that the voltage dividing resistors R1 and R2 are arranged outside the power supply controller 1. The feedback voltage FB generated by dividing the output voltage Vout by the external voltage dividing resistors R1 and R2 is applied to the external terminal Pn5. The terminal voltage V5 of the external terminal Pn5 is applied to the inverting input end (−) of the error amplifier 2.

In such an embodiment, the low voltage detection unit 8 detects an abnormality in which a short circuit is caused between the external terminal Pn5 and in which the adjacent external terminal Pn4 and the terminal voltage V5 becomes the ground potential (0 V). When the low voltage detection unit 8 is configured by the first configuration example (FIG. 3) or the second configuration example (FIG. 4) described above, it is sufficient if the threshold voltage Vth or the threshold voltage TH is set to be higher than 0 V and lower than the value of the feedback voltage FB at the normal state.

When the low voltage detection unit 8 detects the low voltage of the terminal voltage V5, the selector 10 chooses the second clock signal CK2. As a result, the duty of the PWM signal PWM is limited by the duty of the second clock signal CK2 as in the first embodiment. Accordingly, the output voltage Vout is limited, and overvoltage can be avoided.

<Chattering Prevention Function of Power Supply Controller>

Figure 8:
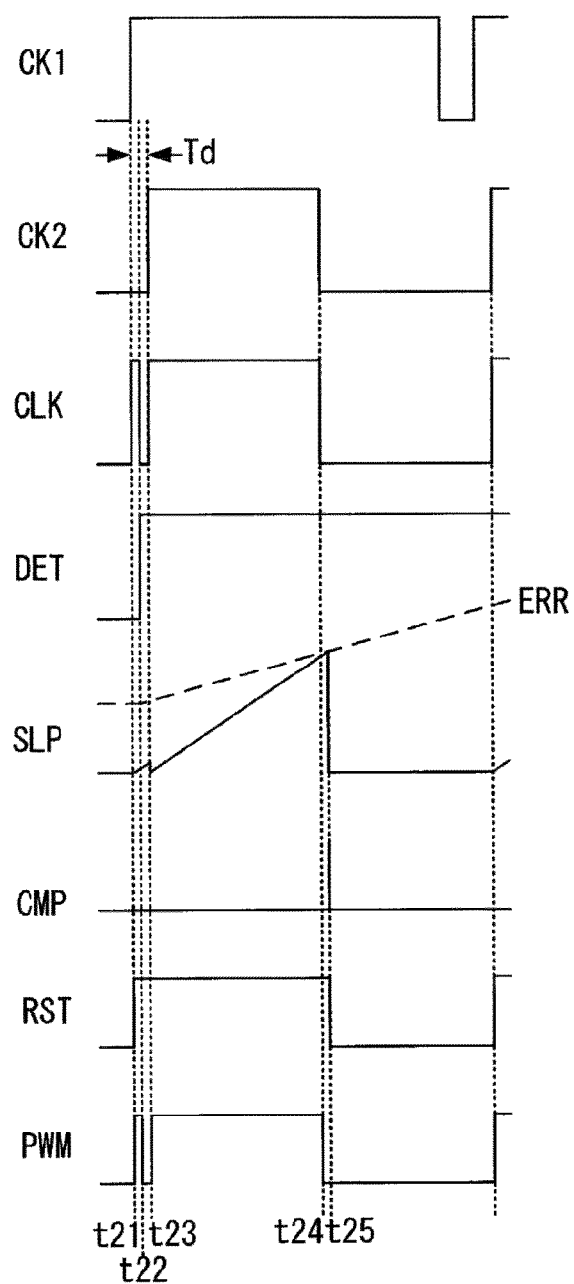
FIG. 8 is a timing chart illustrating an example of a chattering occurrence.
Figure 10:
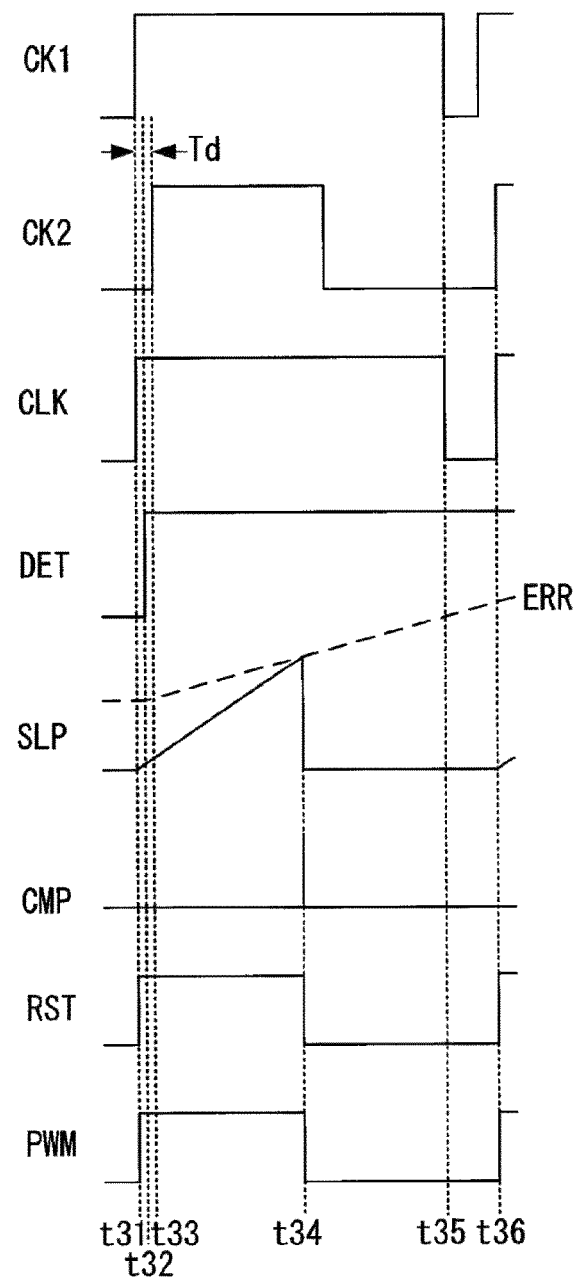
FIG. 10 is a timing chart illustrating an operation example of the power supply controller according to the modification example of the first embodiment.

FIG. 8 illustrates a timing chart at the time of switching from the first clock signal CK1 to the second clock signal CK2 in the power supply controller of the first embodiment or the second embodiment described above. Note that the detection signal DET is also illustrated in FIG. 8 and FIG. 10 to be described later.

In FIG. 8, the first clock signal CK1 is chosen by the selector 10 at the timing t21, and the chosen clock signal CLK rises in response to the rise of the first clock signal CK1. As a result, the slope signal SLP starts rising from the initial value, and the reset signal RST and the PWM signal PWM rise.

After that, when an abnormality occurs in the external terminal Pn5 at the timing t22, the detection signal DET output from the low voltage detection unit 8 is switched to a high level, and the second clock signal CK2 is chosen by the selector 10. Here, in the example illustrated in FIG. 8, since the rising timing of the second clock signal CK2 lags by the delay time Td behind the rising timing of the first clock signal CK1, the chosen clock signal CLK drops at the timing t22. As a result, the PWM signal PWM also drops.

After that, when the second clock signal CK2 rises at the timing t23, the chosen clock signal CLK also rises. Due to this, the slope signal SLP starts to rise again from the initial value, the reset signal RST is at a high level, and the PWM signal PWM rises.

As described above, due to the lag of the second clock signal CK2 behind the first clock signal CK1, chattering occurs in the PWM signal PWM when the chosen clock signal is switched.

In the example of FIG. 8, the error signal ERR starts to rise due to the occurrence of an abnormality at the timing t22, and the slope signal SLP exceeds the error signal ERR at the timing t25. Accordingly, the comparison signal CMP rises, and the reset signal RST is reset to drop. Further, since the second clock signal CK2 and the chosen clock signal CLK drop at the timing t24 before the timing t25, the PWM signal PWM drops at the timing t24.

Figure 9:
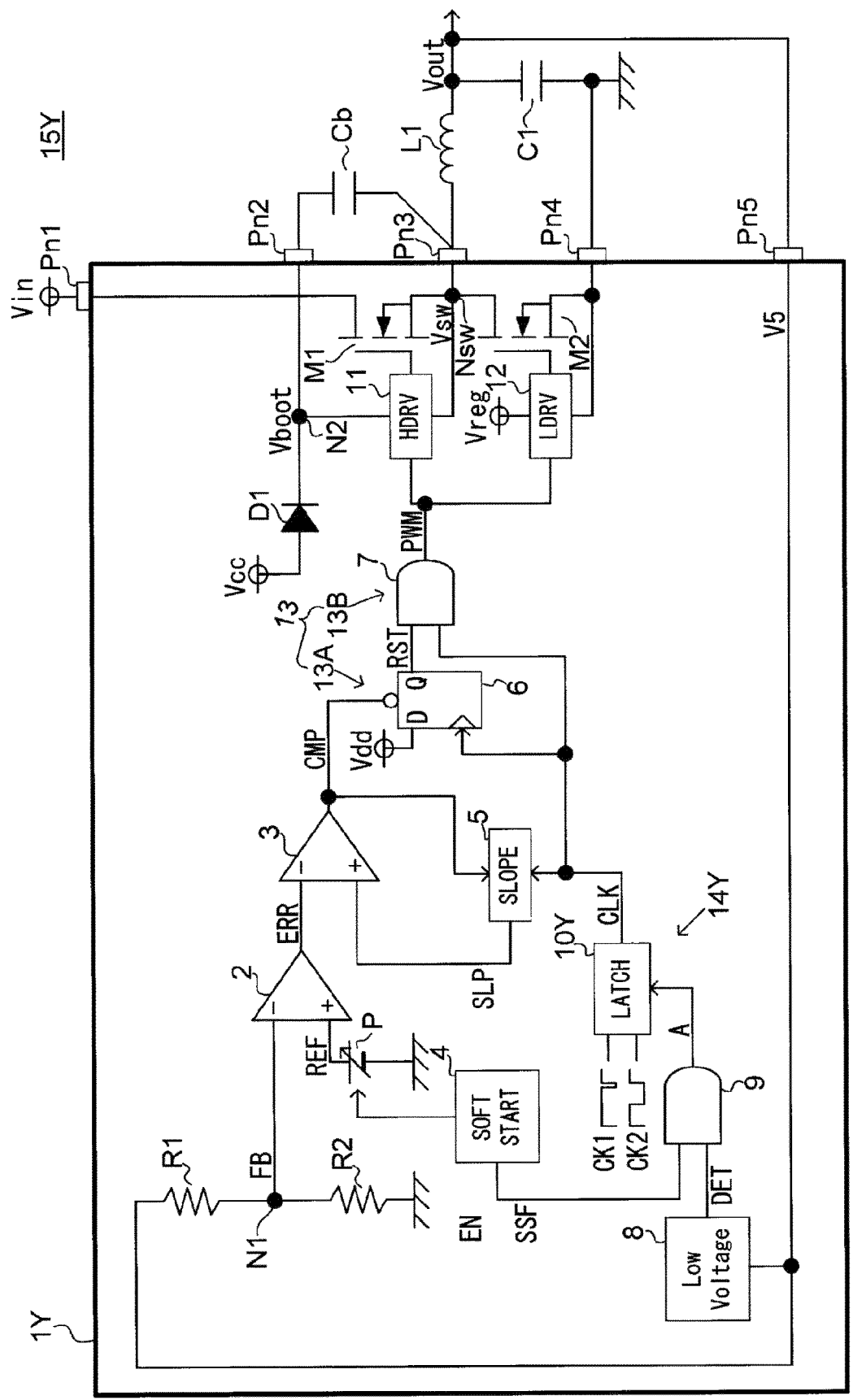
FIG. 9 is a diagram illustrating a configuration of a power supply controller according to a modification example of the first embodiment.

In order to suppress such chattering, a power supply controller 1Y as illustrated in FIG. 9 may be adopted as a modification example of the first embodiment. The power supply controller 1Y is provided with a latch unit 10Y instead of the selector 10 as a difference from the first embodiment. That is, a selection unit 14Y includes the AND circuit 9 and the latch unit 10Y.

When the low voltage of the terminal voltage V5 is detected by the low voltage detection unit 8 and the output A of the AND circuit 9 is switched from a low level to a high level, in the case where the level of the first clock signal CK1 chosen at that time is a high level, the latch unit 10Y maintains the choice of the first clock signal CK1 while the high level is maintained, and the latch unit 10Y switches the choice to the second clock signal CK2 when the first clock signal CK1 falls to a low level.

Here, an operation example by the latch unit 10Y is illustrated in the timing chart in FIG. 10. At the timing t31 in FIG. 10, the first clock signal CK1 is chosen by the latch unit 10Y, and the chosen clock signal CLK rises in response to the rise of the first clock signal CK1.

After that, at the timing t32, the low voltage detection unit 8 detects the low voltage of the terminal voltage V5, and the detection signal DET is switched to a high level. Then, since the first clock signal CK1 chosen at that time is at a high level, the latch unit 10Y maintains the choice of the first clock signal CK1 until the first clock signal CK1 falls to a low level at the timing t35. Thus, the chosen clock signal CLK is kept at a high level until the timing t35.

In the example of FIG. 10, the error signal ERR starts to rise due to the occurrence of an abnormality at the timing t32, and the slope signal SLP exceeds the error signal ERR at the timing t34. Accordingly, the comparison signal CMP rises, and the reset signal RST is reset and drops. Due to this, the PWM signal PWM drops at the timing t34.

Then, at the timing t35 when the first clock signal CK1 falls, the latch unit 10Y chooses the second clock signal CK2. Here, since the second clock signal CK2 is already at a low level, the chosen clock signal CLK falls. After that, when the second clock signal CK2 rises at the timing t36, the chosen clock signal CLK also rises. Due to this, the reset signal RST rises, and the PWM signal PWM also rises.

As described above, since chattering does not occur in the chosen clock signal CLK, chattering in the PWM signal PWM can be avoided as well.

If the first clock signal CK1 is at a low level when the detection signal DET is switched to a high level, the latch unit 10Y immediately switches to the choice of the second clock signal CK2.

Further, the latch unit 10Y can also be applied to the power supply controller of the second embodiment.

<Others>

Although the embodiments of the present disclosure have been described above, the embodiments can be modified in various ways within the scope of the gist of the present disclosure.

For example, the levels of the chosen clock signal CLK, reset signal RST, and PWM signal PWM may be inverted from the above-described embodiment. That is, the PWM signal PWM may be generated so as to be at a low level (first level) during the period that is an overlap between the period during which the reset signal RST is at a low level (first level) and the period during which the chosen clock signal CLK is at a low level (first level).

Further, the power supply controller according to the embodiment of the present disclosure is not limited to the step-down type DC/DC converter and may be applied to, for example, a step-up type or step-up/down type DC/DC converter.

The present disclosure can be used in various DC/DC converters.

What is claimed is:

1. A power supply controller used in a direct to direct converter, the power supply controller comprising:
   a feedback control unit that generates a pulse-shaped pulse width modulation signal having a first level that is one of a high level and a low level and a second level that is an other of the high level and the low level, on a basis of a feedback voltage based on an output voltage of the direct to direct converter;
   a low voltage detection unit that detects a low voltage of the feedback voltage; and
   a selection unit that chooses, as a chosen clock signal, a first clock signal having a high duty when the low voltage is not detected by the low voltage detection unit, and chooses a second clock signal having a low duty when the low voltage is detected by the low voltage detection unit, wherein
   the feedback control unit includes
      a reset signal generation unit that generates a pulse-shaped reset signal having the first level and the second level, based on the feedback voltage, and
      a pulse width modulation signal generation unit that generates the pulse width modulation signal at the first level during a period that is an overlap between a period during which the reset signal is at the first level and a period during which the chosen clock signal is at the first level.

2. The power supply controller according to claim 1, wherein
   the pulse width modulation signal generation unit is an AND circuit into which the reset signal and the chosen clock signal are input.

3. The power supply controller according to claim 1, wherein
   the reset signal generation unit includes
      an error amplifier to which the feedback voltage and a reference voltage are input,
      a slope generation unit that generates a slope signal, and
      a pulse width modulation comparator to which an error signal output from the error amplifier and the slope signal are input.

4. The power supply controller according to claim 3, further comprising:
   a soft start unit that raises the reference voltage at startup, wherein
   the selection unit ignores a detection result from the low voltage detection unit until a signal indicating completion of a soft start is output from the soft start unit.

5. The power supply controller according to claim 1, wherein
   the low voltage detection unit includes
      a resistor with one end connected to a terminal to which a power supply voltage is applied, and
      a negative-channel metal oxide semiconductor transistor including a drain connected to an other end of the resistor, a source connected to a terminal to which a ground potential is applied, and a gate to which a voltage based on the output voltage is applied.

6. The power supply controller according to claim 1, wherein
   the low voltage detection unit has a comparator in which a voltage based on the output voltage and a threshold voltage are input.

7. The power supply controller according to claim 1, wherein
   in a case where the low voltage is detected by the low voltage detection unit and a level of the first clock signal chosen at that time is the first level, the selection unit maintains a choice of the first clock signal while the first level is maintained, and the selection unit switches to a choice of the second clock signal when the first clock signal is switched to the second level.

8. The power supply controller according to claim 1, further comprising:
   an external terminal to which the output voltage is applied; and
   a voltage dividing resistor that divides a terminal voltage of the external terminal to generate the feedback voltage.

9. The power supply controller according to claim 1, further comprising:
   a first external terminal to which the feedback voltage is applied; and
   a second external terminal to which a ground potential is applied and that is arranged near the first external terminal.

10. A direct to direct converter comprising:
    the power supply controller according to claim 1; and
    a transistor that is switched based on a pulse width modulation signal generated by the power supply controller.

* * * * *